United States Patent
Okamura

(10) Patent No.: US 7,118,978 B2
(45) Date of Patent: Oct. 10, 2006

(54) SEMICONDUCTOR DEVICE AND METHOD FOR PRODUCING THE SAME

(75) Inventor: Tomohiro Okamura, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/989,024

(22) Filed: Nov. 16, 2004

(65) Prior Publication Data
US 2005/0260805 A1 Nov. 24, 2005

(30) Foreign Application Priority Data
May 20, 2004 (JP) .............................. 2004-150281

(51) Int. Cl.
*H01L 21/336* (2006.01)
(52) U.S. Cl. ..................... 438/300; 438/303; 438/305; 438/406; 438/407; 438/423
(58) Field of Classification Search ................ 438/149, 438/300, 303, 305, 406, 407, 423
See application file for complete search history.

(56) References Cited

U.S. PATENT DOCUMENTS

| | | | | |
|---|---|---|---|---|
| 3,955,181 | A * | 5/1976 | Raymond, Jr. .............. | 365/149 |
| 5,168,072 | A | 12/1992 | Moslehi | |
| 5,504,031 | A * | 4/1996 | Hsu et al. .................... | 438/231 |
| 5,998,248 | A * | 12/1999 | Ma et al. ..................... | 438/231 |
| 6,051,509 | A * | 4/2000 | Tsuchiaki ................... | 438/758 |
| 6,214,679 | B1 * | 4/2001 | Murthy et al. .............. | 438/299 |
| 6,287,924 | B1 * | 9/2001 | Chao et al. .................. | 438/300 |
| 6,303,450 | B1 * | 10/2001 | Park et al. ................... | 438/300 |
| 6,391,692 | B1 * | 5/2002 | Nakamura .................. | 438/151 |
| 6,429,084 | B1 * | 8/2002 | Park et al. ................... | 438/305 |
| 6,812,105 | B1 * | 11/2004 | Dokumaci et al. .......... | 438/300 |
| 6,821,856 | B1 * | 11/2004 | Takagi ........................ | 438/294 |
| 6,828,630 | B1 * | 12/2004 | Park et al. ................... | 257/339 |
| 2005/0136606 | A1 * | 6/2005 | Rulke et al. ................. | 438/305 |
| 2005/0170604 | A1 * | 8/2005 | Orlowski et al. ........... | 438/404 |

FOREIGN PATENT DOCUMENTS

JP  2001-068666 A  3/2001

* cited by examiner

*Primary Examiner*—Mary Wilczewski
*Assistant Examiner*—Toniae M. Thomas
(74) *Attorney, Agent, or Firm*—Shinjyu Global IP

(57) ABSTRACT

A method for producing a semiconductor device with an SOI substrate having a support substrate 1 and a semiconductor layer 3 that interpose a first insulating film 2 between them includes the following steps. An element region and an element-separation region 4 are formed in the semiconductor layer 3. A gate insulating film 5 is formed on the semiconductor layer 3. A gate electrode 6 is formed on the gate insulating film 5. A second insulating film 7 is formed. The gate insulating film 5 is removed. First thickness adjustment is performed. Ion implantation introducing low concentration impurities is performed on the thickness-adjusted semiconductor layers 3 and 8. A first sidewall portion 7a is formed on the side surfaces of the gate electrode 6. A second sidewall portion 10a is formed on the side surfaces of the first sidewall portion 7a.

18 Claims, 2 Drawing Sheets

SEMICONDUCTOR DEVICE AND METHOD FOR PRODUCING THE SAME

BACKGROUND OF THE INVENTION

1. Field of the Invention

The present invention generally relates to a semiconductor device. More specifically, the present invention relates to a semiconductor device, and a method for producing a semiconductor device.

2. Background Information

Recently, significant attention has been given to SOI (Silicon on Insulator)-MOS technology as one technique to achieve higher integration, higher performance, and lower power consumption in semiconductor devices. The following description describes a conventional method for producing an SOI-MOS transistor.

First, an SOI substrate composed of a silicon support substrate, a buried oxide (BOX) film, and a silicon semiconductor layer (SOI layer) is employed, and a field oxide film is formed by a LOCOS (Local Oxidation of Silicon) process or the like, thus, elements are separated. Then, a gate insulating film is formed on the silicon semiconductor layer, and a polysilicon film is additionally formed on the gate insulating film. After a gate electrode is formed by lithography or etching, a low concentration of impurity ions is introduced, thus, an extension region is formed.

Next, a silicon oxide film is deposited by a CVD (Chemical Vapor Deposition) process, and etch back is performed on the silicon oxide film by anisotropic etching. Thus, a sidewall portion is formed. In this etch back process, over etching is performed on the surface of the silicon semiconductor layer in a drain region and a source region of a MOS transistor. Thus, the thicknesses of the regions become thinner than the initial thicknesses thereof.

Subsequently, a silicon epitaxial layer is formed by selective epitaxial growth (SEG) performed on the silicon semiconductor layer in the drain region and the source region. Besides, in selective epitaxial growth, since a crystal also grows on the polysilicon film, a silicon crystal grows also on the upper part of the gate electrode where the surface of polysilicon is exposed.

After the above process is conducted, the MOS transistor is formed through processes such as implantation of a high concentration of impurity ions into the drain and source regions, and the formation of electrode by using silicide.

A semiconductor device including a MOS transistor produced by a semiconductor process is disclosed in Japanese Laid-Open Patent Publication TOKUKAI No. 2001-68666 (especially pages 3–4, FIGS. 1–2), though the semiconductor device does not have an SOI substrate, for example.

The semiconductor device disclosed in JP 2001-68666 has a double sidewall structure composed of a first sidewall portion with an L-shape when viewed in a cross-section of oxide film and a second sidewall portion extending from the side surfaces to a bottom surface of the first sidewall portion of the nitride film. Although the semiconductor device has an electric-field-relaxing structure formed by using LDD (Lightly Doped Drain), implantation of low concentration impurity ions into the extension region is performed after formation of the gate electrode, in other words, previous to the formation of the first and second sidewall portions. Since this semiconductor device does not employ an SOI substrate but a conventional bulk substrate, the silicon semiconductor layer in the drain and source regions has sufficient thickness, thus, the parasitic resistance is small. Accordingly, thickness adjustment for the silicon semiconductor layer by using selective epitaxial growth is not necessary.

Typically, in an SOI substrate, a silicon semiconductor layer (SOI layer) is thin having a thickness of the order of several tens nm. When a silicide electrode is directly formed on a silicon semiconductor layer, the silicide electrode cannot be formed with a sufficient thickness. This causes an increase in sheet resistance. Accordingly, with an SOI-MOS transistor, a technique, which increases the thickness of silicon to the thickness necessary for formation of a silicide electrode with low resistance by growing silicon in drain and source regions by selective epitaxial growth (elevated source/drain structure), is used.

However, in the case that selective epitaxial growth is performed on a thin silicon semiconductor layer, silicon aggregates in the case of growth at typical growth temperatures (for example, 800° C.). The amount of aggregation is inversely proportional to the thickness of the silicon. That is, such aggregation becomes more remarkable as a silicon semiconductor layer is thinner. As mentioned above, in the conventional method for producing an SOI-MOS transistor, over etching is performed on the surface of the silicon semiconductor layer in the etch back process in the formation of the sidewall portion. As a result, the silicon semiconductor layer becomes thinner, and thus, silicon tends to aggregate. Accordingly, it is difficult to provide a silicon epitaxial film with the desired film quality.

Furthermore, implantation of a low concentration of impurity ions into the extension region, so-called extension ion implantation, is performed in order to reduce the resistance value of the silicon semiconductor layer corresponding to the region directly under the sidewall portion. Since the silicon semiconductor layer is thin throughout, this causes large parasitic resistance and reduces the drive power of a MOS transistor.

With the semiconductor device disclosed in JP 2001-68666, the double sidewall structure is composed of the first sidewall portion with an L-shape and the second sidewall portion extending from the side surfaces to the bottom surface of the first sidewall portion, as mentioned above. According to the downscaling of the semiconductor device, reduction of the resistance value directly under the sidewall portion becomes an important issue, particularly with SOI-MOS transistors, whose importance has been indicated. When a double sidewall structure similar to this semiconductor device is applied to a SOI-MOS transistor, the thickness of a double sidewall in the SOI-MOS is almost the same as that of a thick single sidewall that is applied to the SOI-MOS. The reason is that the first sidewall has a L-shape, and even if the side portion of the first sidewall is thinly formed, the bottom portion of the first sidewall needs to have a given length. In an SOI substrate, a semiconductor layer (SOI layer) is thin having a thickness on the order of several tens nm. Accordingly, if the width of the sidewall portion were large, the parasitic resistance directly under the sidewall portion would become large. With the semiconductor device disclosed in the JP 2001-68666 employing a bulk substrate, the device has a semiconductor layer directly under the sidewall portion with a sufficient thickness. Hence, reduction of parasitic resistance by thickness adjustment of the semiconductor layer in the drain and source regions is not taken into consideration.

In view of the above, it will be apparent to those skilled in the art from this disclosure that there exists a need for an improved semiconductor device and method for producing the same. This invention addresses this need in the art as well as other needs, which will become apparent to those skilled in the art from this disclosure.

SUMMARY OF THE INVENTION

A method for producing a semiconductor device according to a first aspect of the present invention in an SOI substrate having a support substrate and a semiconductor layer that interpose a first insulating film between them, includes steps of forming an element region and an element-separation region in the semiconductor layer; forming a gate insulating film on the semiconductor layer in the element region; forming a gate electrode on the gate insulating film; forming a second insulating film overlaying the peripheral surfaces of the gate electrode; removing the gate insulating film by using the gate electrode overlaid by the second insulating film as a mask; performing a first thickness adjustment by a selective epitaxial growth process so that the thickness of the semiconductor layer is a predetermined thickness after the gate insulating film is removed; performing ion implantation introducing a low concentration of impurities on the thickness-adjusted semiconductor layer; forming a first sidewall portion on the side surfaces of the gate electrode by removing the second insulating film on the upper surface of the gate electrode; and forming a second sidewall portion on the side surfaces of the first sidewall portion.

The method for producing a semiconductor device according to a second aspect of the present invention is the method of the first aspect and further comprises a step of performing a second thickness adjustment by a selective epitaxial growth process so that the thickness of the semiconductor layer corresponding to a drain portion and a source portion surrounded by the second sidewall portion and the element-separation region is a predetermined thickness after the second sidewall portion is formed.

According to the present invention, a double sidewall structure is provided, and thickness adjustment (i.e., increasing thickness) is performed on the silicon semiconductor layer previous to formation of the second sidewall portion. Thus, it is possible to reduce the resistance value of the silicon semiconductor layer directly under the second sidewall portions. In the present invention, in the case that the first sidewall portion is formed to be thin compared with the second sidewall portion, it is possible to reduce the resistance value of the silicon semiconductor layer directly under the sidewall structure as a whole.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Embodiment 1

In a first preferred embodiment of the present invention, a double sidewall structure composed of first and second sidewall portions is provided. The thickness of a silicon semiconductor layer (SOI layer) corresponding to the region directly under the second sidewall portion is adjusted by selective epitaxial growth after the first sidewall portion is formed.

Figure 1:
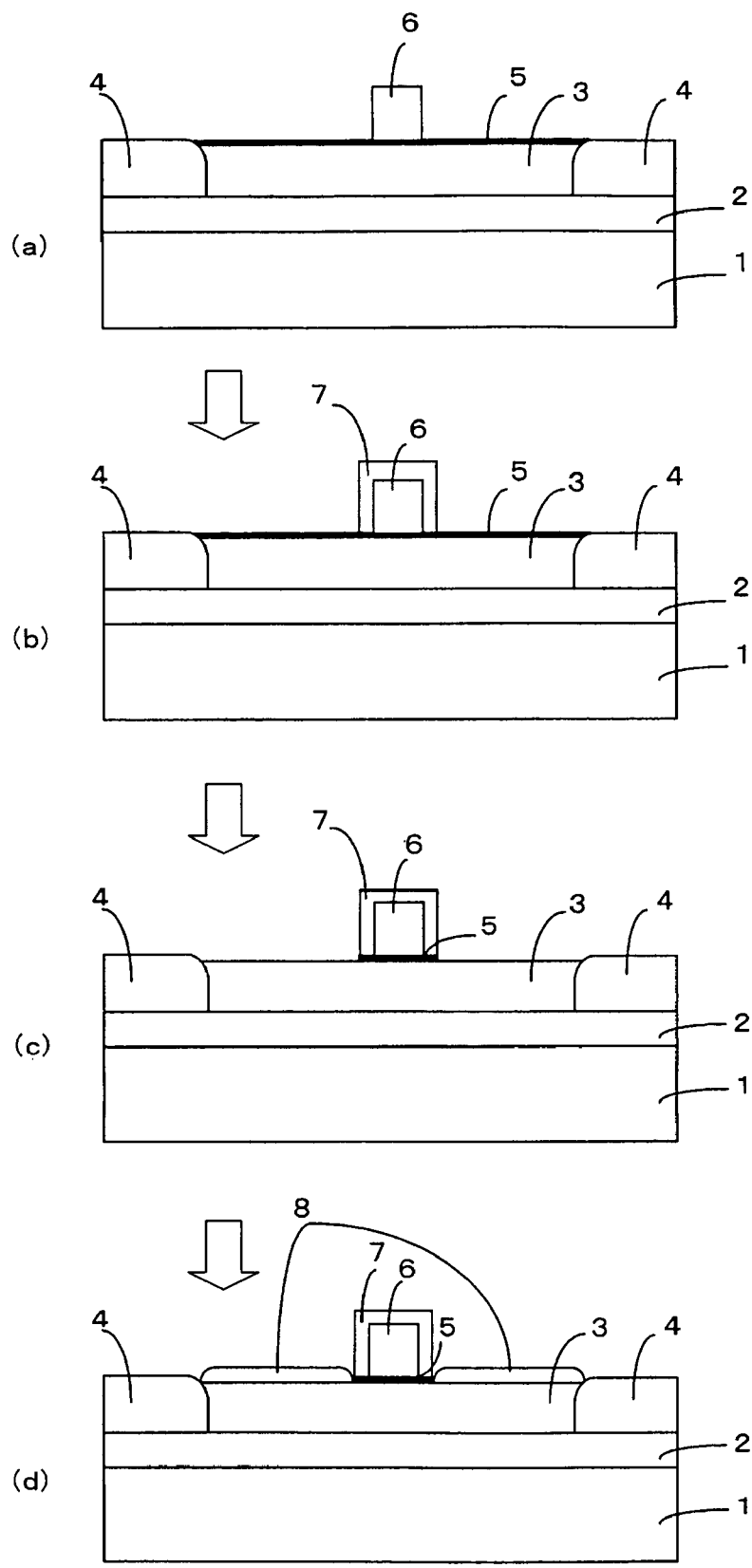
FIG. 1 is a cross-sectional view of a method for producing an SOI semiconductor device in accordance with first and second preferred embodiments of the present invention.
Figure 2:
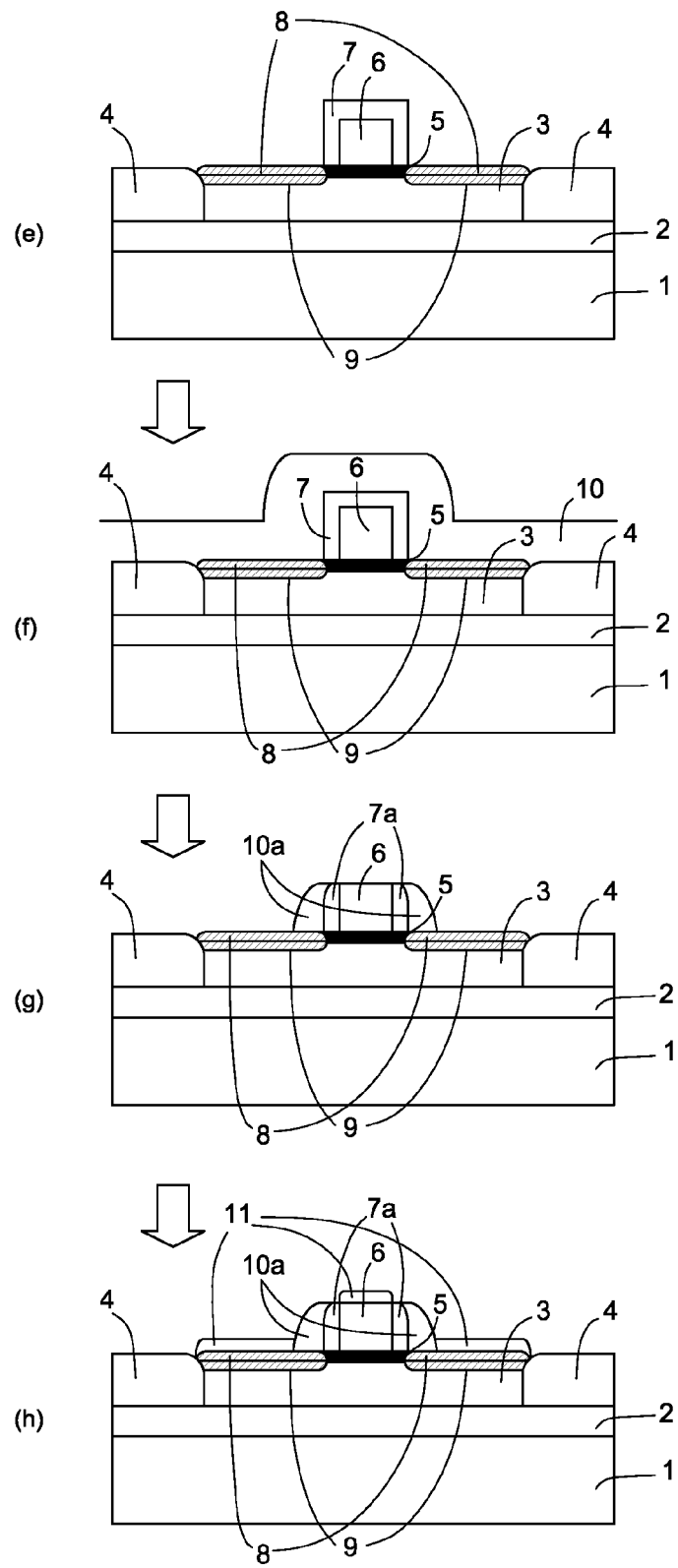
FIG. 2 is a cross-sectional view of a method for producing an SOI semiconductor device in accordance with the first and second embodiments.

FIGS. 1 and 2 are cross-sectional views illustrating a method for producing an SOI semiconductor device according to the first embodiment of the present invention. This SOI semiconductor device operates in a fully depleted (FD) mode. The SOI semiconductor device may, however, be a partially depleted (PD) SOI semiconductor device. The present invention is particularly effective for an SOI semiconductor device having a silicon semiconductor layer formed to be thin having a thickness of not larger than 50 nm, for example. However, the effect does not depend on the thickness of the silicon semiconductor layer. Regardless, the present invention can be applied to general semiconductor devices which have an SOI substrate.

First, an SOI substrate that includes a support substrate 1 of silicon, a buried oxide film (BOX) 2 (first insulating film), and a semiconductor layer (SOI layer) 3 of single crystal silicon is prepared. The SOI substrate can be a SIMOX (Silicon Implanted Oxide) substrate or a bonded substrate.

Then, as shown in line (a) of FIG. 1, a silicon oxide film and a silicon nitride film are successively formed on the SOI substrate. Further, a field oxide film 4 is formed by a conventional LOCOS (Local Oxidation of Silicon) process, and elements are separated. Thus, the field oxide film 4 forms an element-separation region and the rest of the silicon semiconductor layer 3 forms an element region. A gate insulating film 5 made of a silicon oxide-nitride film is formed on the silicon semiconductor layer 3. The silicon oxide-nitride film serves also as an oxidation-reduction mask when the semiconductor layer is thermally oxidized. A method for introducing nitrogen onto the surface of a silicon oxide film after the silicon oxide film is formed, or furnace annealing with $N_2O$ gas or the like, can be used as a method for forming the silicon oxide-nitride film, however, the method is not limited thereto. Next, a polysilicon film is formed on the gate insulating film 5, and a gate electrode 6 is formed by lithography and etching.

Subsequently, as shown in line (b) of FIG. 1, a silicon oxide film 7 is formed on the surface of the gate electrode 6 by thermal oxidation. This silicon oxide film 7 serves to prevent a short between the gate and the drain or the source in selective epitaxial growth (described later). Thus, the silicon oxide film 7 is a second insulating film. The silicon oxide film 7 later becomes the first sidewall portion. In the thermal oxidation, since the gate insulating film 5 serves as an oxidation-reduction mask, the silicon semiconductor layer 3 directly under the gate insulating film 5 is not oxidized. Accordingly, its thickness before thermal oxidation is mostly maintained.

Subsequently, the gate insulating film 5 is removed by wet etching. An HF solution and so on can be used as an etching solution. The reason for use of wet etching is to minimize over etching of the silicon semiconductor layer 3 directly under the gate insulating film 5. In the etching of the gate insulating film 5, the silicon oxide film 7 is also etched, and the silicon oxide film 7 is formed to be thin on the peripheral surfaces of the gate electrode 6, as shown in line (c) of FIG. 1.

As shown in line (d) of FIG. 1, selective epitaxial growth is performed on the exposed silicon semiconductor layer 3, and a silicon epitaxial layer 8 is formed with a desired thickness. Thus, a first thickness adjustment is made. Besides, in selective epitaxial growth of silicon, a silicon crystal grows not only on the surface of silicon but also on the surface of a polysilicon. However, since the whole surface of gate electrode 6 is covered with the silicon oxide film 7, the epitaxial film grows only on the silicon semiconductor layer 3.

As shown in line (e) of FIG. 2, low concentration impurity ions are introduced for adjustment of the resistance value, thus, an extension region 9 is formed. A synergistic effect of the thickness adjustment and the ion implantation can reduce the resistance value of the silicon semiconductor layer directly under the second sidewall portion described later. A low concentration of impurity ions is defined as less than or equal to $1\times10^{15}$ ions/cm$^2$. A high concentration is greater than $1\times10^{15}$ ions/cm$^2$. For this invention it is preferred to use a low concentration of impurity ions in the range of $1\times10^{14}$ ions/cm$^2$ to $1\times10^{15}$ ions/cm$^2$. For this invention a high concentration of impurity ions would be in the range of $1\times10^{15}$ ions/cm$^2$ to $1\times10^{16}$ ions/cm$^2$.

Subsequently, a silicon oxide film 10 is deposited by a CVD process, as shown in line (f) of FIG. 2.

Then, etch back on the silicon oxide film 10 is performed by anisotropic etching such as reactive ion etching (RIE), thus, the second sidewall portion 10a is formed, as shown in line (g) of FIG. 2. During this etch back process, the silicon oxide film (first sidewall portion) 7 of the upper part of the gate electrode 6 is simultaneously removed, and the first sidewall portion 7a made of silicon oxide film is formed only on the side surfaces of the gate electrode 6.

After that, the MOS transistor is formed in a known manner (not shown).

Operation/Working-Effect

In the method for producing the SOI semiconductor device of the first embodiment, the double sidewall structure is provided, the thicknesses of the silicon semiconductor layers 3 and 8 are adjusted previous to formation of the second sidewall portion 10a, and extension ion implantation is performed. A synergistic effect of these factors can reduce the resistance value of the silicon semiconductor layer directly under the second sidewall portion 10a. In terms of the whole of the sidewall structure, the thickness of the first sidewall portion 7a is thin. Thus, the sidewall structure is mostly composed of the second sidewall portion 10a. Accordingly, reduction of the resistance value corresponding to the semiconductor layers 3 and 8 directly under the second sidewall portion 10a gives the same result as reduction of the resistance value of the semiconductor layer directly under the whole sidewall structure, and thus improves performance of the MOS transistor.

Furthermore, the gate insulating film 5 is removed by wet etching. Thus, over etching of the silicon semiconductor layer 3 directly under the gate insulating film 5 can be kept to a minimum. Therefore, the silicon epitaxial film 8 having sufficient film quality and film thickness can be formed. As a result, it is possible to provide the silicide electrode formed in the drain and source regions with lower resistance.

Moreover, the thickness of the thin first sidewall portion 7a, which does not have an impurity layer directly under the first sidewall portion 7a, is optimized. Accordingly, it can be expected to keep in check overlap capacity produced by the geometric overlap between the gate region and the drain region or the source region, or the short channel effect produced by the increase of electric field near the drain.

One effect of using the gate insulating film 5 with oxidation resistance is that the oxide film can be effectively formed only around the gate electrode 6 without affecting the silicon semiconductor layer 3 under the gate insulating film 5 in the thermal oxidation process of forming silicon oxide film 7 that becomes the first sidewall portion 7a later.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Second Embodiment

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

In a second embodiment, after the second sidewall portion is formed, selective epitaxial growth is additionally performed again. Thus, the thickness of the semiconductor layer in the drain and source regions is adjusted.

The second embodiment includes the processes of the first embodiment with an additional process. Line (h) of FIG. 2 is a sectional view provided to explain the additional process.

The first sidewall portion 7a and the second sidewall portion 10a are formed through the processes of FIG. 1 and lines (e) to (g) of FIG. 2, in a manner similar to or the same as the first embodiment. Etching is performed partially on the silicon epitaxial film 8 in the drain and source regions surrounded by the second sidewall portion 10a and the field oxide 4 in the etch back process to form the first and second sidewall portions mentioned above. In the case that a silicide electrode is formed on the silicon semiconductor layer 3 by interposing the silicon epitaxial film 8 between a silicide electrode and semiconductor layer in the drain and source regions, when Co-silicide is formed, for example, it is difficult to provide the silicide electrode with low resistance if the thickness of the silicon layer including the silicon semiconductor layer 3 and the silicon epitaxial layer 8 is not more than 30 nm. This additional process adjusts the thickness of the silicon epitaxial film 8 in the drain and source regions again after the etch back process in the formation of the first and second sidewall portions.

As shown in line (h) of FIG. 2, selective epitaxial growth is performed on the silicon epitaxial film 8 in the drain and source regions. Thus, the silicon epitaxial film 11 with the desired thickness is formed. In this case, since the surface of a polysilicon is exposed on the upper part of the gate electrode 6, the silicon crystal grows also on the upper part of gate electrode 6. Accordingly, in order to form the gate electrode 6 with a desired thickness, it is necessary to set the process to obtain a desired total thickness of film including the polysilicon film and the epitaxial film.

Besides, the additional process in this embodiment is not specifically required when the silicon epitaxial film 8 has a sufficient thickness after the etch back process in the formation of the first and second sidewall portions.

Operation/Working-Effect

In the method for producing the SOI semiconductor device of the second embodiment, selective epitaxial growth is performed again after the etch back process in the formation of the first and second sidewall portions, therefore, it is ensured to obtain the thickness of silicon film necessary for formation of silicide electrode with low resistance.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-150281. The entire disclosure of Japanese Patent Application No. 2004-150281 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for producing a semiconductor device comprising:
    preparing an SOI substrate having a first insulating film between a support substrate and a semiconductor layer;
    forming an element region and an element-separation region in said semiconductor layer;
    forming a gate insulating film on said semiconductor layer in said element region;
    forming a gate electrode on said gate insulating film;
    forming a second insulating film overlaying an upper surface and side surfaces of said gate electrode;
    removing said gate insulating film by using said gate electrode overlaid by said second insulating film as a mask, wherein said upper surface and said side surfaces of said gate electrode are overlaid by said second insulating film after said removal of said gate insulating film;
    performing a first thickness adjustment by a selective epitaxial growth process to obtain a predetermined thickness of said semiconductor layer after removing said gate insulating film;
    performing ion implantation introducing a low concentration of impurities on said semiconductor layer;
    forming a first sidewall portion on side surfaces of said gate electrode by removing said second insulating film on an upper surface of said gate electrode; and
    forming a second sidewall portion on side surfaces of said first sidewall portion.

2. The method for producing a semiconductor device according to claim 1, wherein said first thickness adjustment is performed in a state in which said second insulating film overlays peripheral surfaces of said gate electrode.

3. The method for producing a semiconductor device according to claim 2, wherein said second insulating film is a thermal oxide film.

4. The method for producing a semiconductor device according to claim 3, wherein said gate insulating film is an oxide-nitride film, and said thermal oxide film is formed by thermally oxidizing peripheral surfaces of said gate electrode while thermal oxidation to said semiconductor layer under said gate insulating film is restrained while forming said thermal oxide film.

5. The method for producing a semiconductor device according to claim 1, wherein forming a second sidewall portion includes forming a third insulating film over at least the second insulating film and the semiconductor layer after performing said first thickness adjustment, and performing etch back on said third insulating film.

6. The method for producing a semiconductor device according to claim 5, wherein said first thickness adjustment is performed in a state in which said second insulating film overlays peripheral surfaces of said gate electrode.

7. The method for producing a semiconductor device according to claim 6, wherein said second insulating film is a thermal oxide film.

8. The method for producing a semiconductor device according to claim 7, wherein said gate insulating film is an oxide-nitride film, and said thermal oxide film is formed by thermally oxidizing peripheral surfaces of said gate electrode while thermal oxidation to said semiconductor layer under said gate insulating film is restrained while forming said thermal oxide film.

9. The method for producing a semiconductor device according to claim 5, wherein forming a first sidewall portion is performed simultaneously while performing etch back on said third insulating film.

10. The method for producing a semiconductor device according to claim 1, wherein over etching on said semiconductor layer directly under said gate insulating film is restrained by performing wet etching on said gate insulating film while removing said gate insulating film.

11. The method for producing a semiconductor device according to claim 1, wherein said second sidewall portion is an oxide film formed by a CVD process.

12. The method for producing a semiconductor device according to claim 1, wherein said first sidewall portion is thinner than said second sidewall portion.

13. The method for producing a semiconductor device according to claim 1, further comprising the step of performing a second thickness adjustment by a selective epitaxial growth process to correspond to a thickness of said semiconductor layer to a drain portion and a source portion surrounded by said second sidewall portion and to form said element-separation region to a predetermined thickness after said second sidewall portion is formed.

14. The method for producing a semiconductor device according to claim 1, wherein said gate electrode is comprised of polysilicon.

15. A method for producing a semiconductor device comprising:

preparing an SOI substrate having a first insulating film between a support substrate and a semiconductor layer;

forming an element region and an element-separation region in said semiconductor layer;

forming a gate insulating film on said semiconductor layer in said element region;

forming a gate electrode on said gate insulating film;

forming a second insulating film overlaying peripheral surfaces of said gate electrode;

removing said gate insulating film by using said gate electrode overlaid by said second insulating film as a mask;

performing a first thickness ajustment by a selective epitaxial growth process to obtain a predetermined thickness of said semiconductor layer after removing said gate insulating film;

preforming ion implantation introducing a low concentration of impurities on said semiconductor layer;

forming a first sidewall portion on side surfaces of said gate electrode by removing said second insulating film on an upper surface of said gate electrode;

forming a second sidewall portion on side surfaces of said first sidewall portion; said second sidewall formation step including the steps of forming a third insulating film over at least the second insulating film and the semicoductor layer after preforming said first thickness adjustment, and preforming etch back on said third insulating film;

wherein said first sidewall portion is formed simultaneously with said preformance of said etch back on said third insulating film.

16. The method for producing a semiconductor device according to claim 15, wherein said gate electrode is comprised of polysilicon.

17. A method for producing a semiconductor device, comprising:

preparing an SOI substrate having a first insulating film between a support substrate and a semiconductor layer;

forming an element region and an element-separation region in said semiconductor layer;

forming a gate insulating film on said semiconductor layer in said element region;

forming a gate electrode on said gate insulating film;

forming a second insulating film overlaying peripheral surfaces of said gate electrode;

removing said gate insulating film by using said gate electrode overlaid by said second insulating film as a mask;

performing a first thickness adjustment by a selective epitaxial growth process to obtain a predetermined thickness of said semiconductor layer after removing said gate insulating film;

performing ion implantation introducing a low concentration of impurities on said semiconductor layer;

forming a first sidewall portion on side surfaces of said gate electrode by removing said second insulating film on an upper surface of said gate electrode; and forming a second sidewall portion on side surfaces of said first sidewall portion, wherein over etching on said semiconductor layer directly under said gate insulating film is restrained by performing wet etching on said gate insulating film while removing said gate insulating film.

18. The method for producing a semiconductor device according to claim 17, wherein said gate electrode is comprised of polysilicon.

* * * * *